United States Patent [19]
Blonder et al.

[11] Patent Number: 5,291,572
[45] Date of Patent: Mar. 1, 1994

[54] ARTICLE COMPRISING COMPRESSION BONDED PARTS

[75] Inventors: Greg E Blonder, Summit; William M. MacDonald, Flemington, both of N.J.

[73] Assignee: AT&T Bell Laboratories, Murray Hill, N.J.

[21] Appl. No.: 4,361

[22] Filed: Jan. 14, 1993

[51] Int. Cl.$^5$ .............................................. G02B 6/42
[52] U.S. Cl. ........................................ 385/94; 385/88; 385/92
[58] Field of Search ................... 385/88, 92, 93, 94

[56] References Cited

U.S. PATENT DOCUMENTS

| | | | |
|---|---|---|---|
| 4,119,363 | 10/1978 | Camlibel et al. | 350/96.20 |
| 4,876,457 | 10/1989 | Bose | 250/563 |
| 4,937,653 | 6/1990 | Blonder et al. | 357/68 |
| 4,940,916 | 7/1990 | Borel et al. | 313/306 |
| 5,023,881 | 6/1991 | Ackerman et al. | 372/43 |
| 5,083,031 | 1/1992 | Hoelsher et al. | 250/482.1 |
| 5,124,281 | 6/1992 | Ackerman et al. | 437/209 |

FOREIGN PATENT DOCUMENTS

54-54572  4/1979  Japan.

Primary Examiner—John D. Lee
Assistant Examiner—Hemang Sanghavi
Attorney, Agent, or Firm—Eugen E. Pacher

[57] ABSTRACT

An article according to the invention comprises two bodies that are joined together by means of a compression bond, such as to form an enclosure. One of the bodies comprises a (exemplarily Au-covered) textured surface region, and the other body comprises a (exemplarily Au) "O-ring" positioned such as to mate with the textured region, substantially surrounding the enclosure. The textured region comprises at least one (typically two or more) "ridge" that substantially surrounds the enclosure and that, after joining of the two bodies by compression bonding, provides a leakage barrier. Optional ridges between said two or more enclosure-surrounding ridges can further reduce the probability of leakage. The bodies exemplarily are Si bodies, with the enclosure serving to provide a controlled environment for a semiconductor laser. In another exemplary embodiment, the article is a flat panel field emission display.

8 Claims, 3 Drawing Sheets

ARTICLE COMPRISING COMPRESSION BONDED PARTS

FIELD OF THE INVENTION

This invention pertains to articles that compromise compression bonded parts, e.g., a "lid" that is compression bonded to a "box" such that a hermetically sealed enclosure results.

BACKGROUND OF THE INVENTION

In many fields of technology it is necessary to maintain a critical component or assembly in a controlled atmosphere. Exemplary of such technologies are optical communications and flat panel displays. See, for instance, U.S. Pat. No. 4,119,363, which discloses a hermetically sealed housing that contains a laser, with an optical fiber extending into the housing. See also U.S. Pat. No. 4,940,916, incorporated herein by reference, which pertains to field emission flat panel displays. Such displays require that the micropoint field emitters be located within a hermetically sealed enclosure. See also U.S. patent application Ser. No. 07/889,735, also incorporated by reference.

A known method of forming a hermetic enclosure involves solder bonding a piece part to another piece part (frequently to be called herein a "lid" and a "box", respectively), such that the desired enclosure results. However, there are problems associated with this method. For instance, prior art boxes and lids frequently are relatively costly, manufacturing yield typically is determined by the uniformity of wetting of the solder, and the presence of a solder bond places an upper limit on the temperature of any subsequent manufacturing operation.

In view of the economic significance of articles that comprise a hermetically sealed enclosure, a method of forming such an enclosure that does not exhibit the drawbacks of the prior art method would be highly desirable. This application discloses such a method, and articles made by the method.

Compression bonding is a known bonding technique. See, for instance, U.S. Pat. No. 4,937,653, which discloses compression bonding of IC chips to a Si wafer carrier that comprises textured bonding regions. See also Japanese patent document 54-54572/1979, which discloses a Si element that is thermally bonded to a metal pedestal (via a gold or gold alloy layer applied to a "rough" section of the pedestal), with the "roughness" due to indentations formed in the pedestal surface by blades.

SUMMARY OF THE INVENTION

In a broad aspect the invention is embodied in an article that comprises a first body compression bonded to a second body.

More particularly, it is embodied in an article that comprises said first and second bodies, with at least one of the two bodies having a surface that comprises a textured bonding region, with the first body being compression bonded to the second body in the bonding region. Significantly, the textured bonding region surrounds an interior region wherein the first and second bodies are not bonded to each other, and comprises at least one raised feature (such raised features to be referred to herein as "ridges"). Said ridge is continuous and substantially surrounds the interior region. A currently preferred embodiment comprises at least two ridges that are continuous, substantially concentric and substantially surround the interior region, and further comprises optional ridges that extend between the at least two ridges, compartmentalizing the space between the two ridges.

In an exemplary embodiment, one of the two bodies is a box-like structure and the other body forms a "lid" for the "box". The textured surface is coated with an appropriate metal (exemplarily gold or a gold alloy), and the mating surface region of the other body typically is coated with a (typically relatively thick) layer of an appropriate metal (exemplarily also gold or a gold alloy). Compression bonding the lid to the box can result in a hermetically sealed enclosure, with the one or more continuous ridges serving as barriers to the flow of gas. The presence of ridges that extend between two continuous ridges serves to further reduce the probability of a leakage path between the interior of the enclosure and the ambient, as those skilled in the art will appreciate.

Exemplarily, both the box and the lid are made from silicon by known lithography and etching techniques, and serve as hermetic housing for a semiconductor laser. Since hundreds (and even thousands) of such boxes or lids can readily be made by known methods in batch fashion from a single, commercially available silicon wafer, these piece parts can be produced at relatively low cost. Furthermore, manufacturing yield can be relatively high since solder wetting is not a consideration, and the compression bond in articles according to the invention is compatible with substantially any conceivable subsequent heat treatment that is compatible with all other aspects of the article.

DETAILED DESCRIPTION OF AN EXEMPLARY EMBODIMENT

Figure 1:
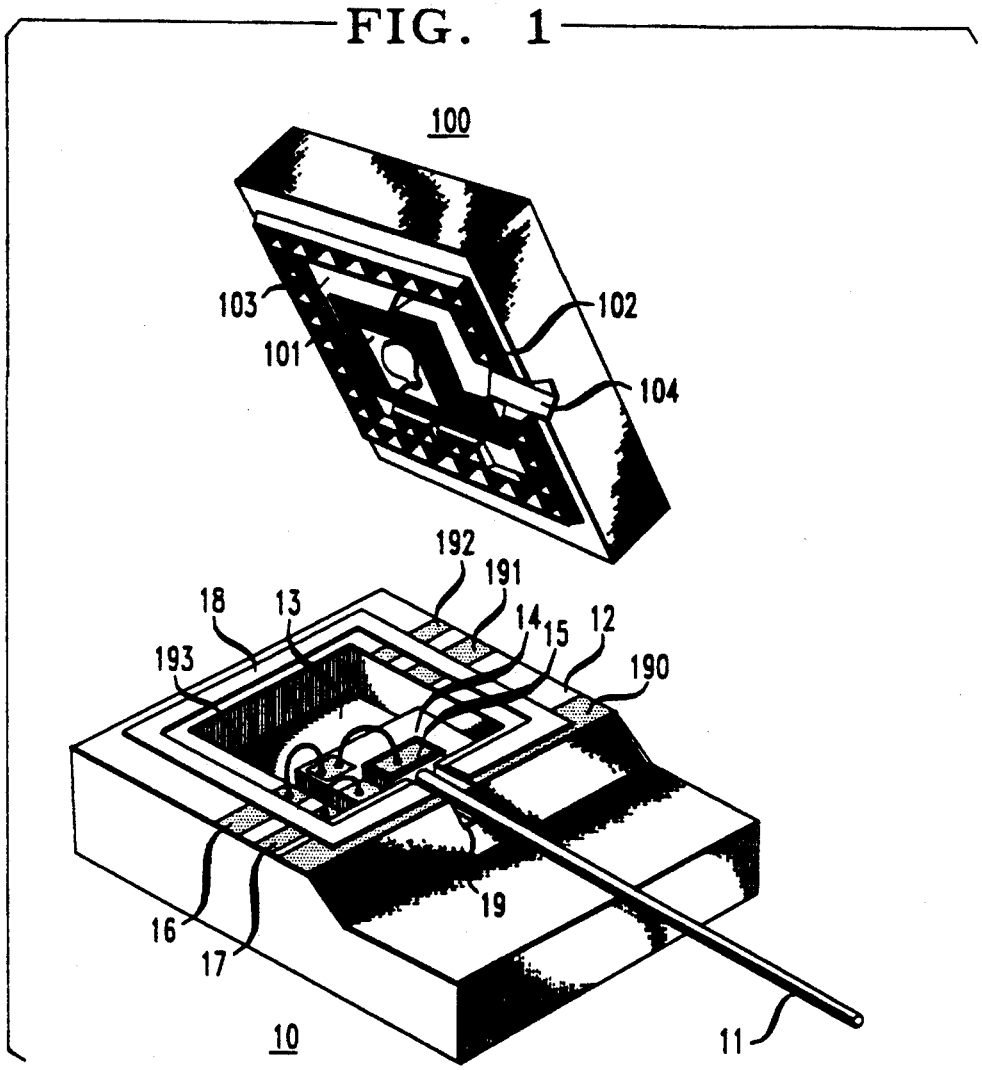
FIG. 1 schematically depicts an exemplary article according to the invention, namely, a laser housing, prior to compression bonding.

A particular and commercially important embodiment of the instant invention is a hermetic enclosure for a semiconductor laser. FIG. 1 schematically depicts the "box" 10 (with attached lensed optical fiber 11) and "lid" 100 of an exemplary laser package according to the invention prior to bonding of the lid to the box. Surface 12 of the box comprises a recessed portion 13 which constitutes the interior of the box. In the recess is mounted laser 15 on submount 14, with electrical contact means (16, 17) provided, all in known manner. Gold (or other appropriate metal) "O-ring" 18 is electrically isolated from the laser contact strips (16, 17) by means of an appropriate insulating layer (not shown) and encloses the recess except for V-groove 19. An optional strip heater 190 facilitates solder bonding fiber 11 to the housing after alignment to the laser, exemplarily as described in U.S. patent application Ser. No. 07/914,782, filed by the instant applicants on Jul. 16, 1992. Optional contact stripes 191 and 192 facilitate electrical contact to optional monitor PIN diode 101 on lid 100. Rear wall 193 of recess 13 serves as turning mirror, directing radiation emitted by the laser in the back direction to monitor 101. See also U.S. Pat. No. 5,124,281.

Boxes and lids as shown are advantageously made from silicon, exemplarily (100)-oriented single crystal Si wafers, by known techniques that include anisotropic etching. Lid 100 comprises textured contact region 102 which surrounds interior region 103 except for V-groove 104, provided to facilitate placement and bonding of fiber 11. The nature of the texture will be described in more detail below. Generally speaking, the texture region comprises at least one (preferably two or more) ridge that is continuous and "substantially" (i.e., completely except for unavoidable gaps such as the due to the V-groove) surrounds the interior region. The textured region is covered with a relatively thin layer of gold (or other appropriate metal) such that a compression bond can be formed between O-ring 18 and the textured region. Such bonding will be referred to as a textured compression bonding (TCB).

Figure 2:
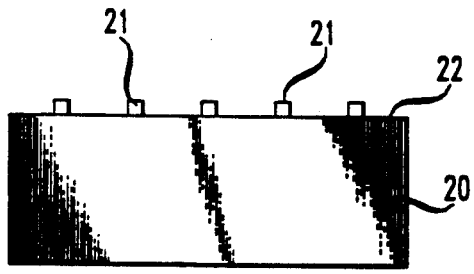
FIGS. 2 to 5 schematically illustrate ridge formation.
Figure 3:
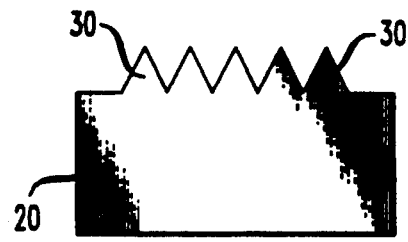

Formation of a textured surface useful in the practice of the invention is schematically illustrated in FIGS. 2 and 3. On (100) surface 22 of Si body 20 are formed relatively narrow (e.g., about 1 $\mu$m) lines 21 of SiO$_2$ by known techniques, the lines to serve as mask during the subsequent selective etching step that results in ridges 30 as shwon in FIG. 3. Onto the textured region is then deposited a layer of metal selected such that by urging the textured surface against appropriately selected metal, a cold weld is formed. Gold is a currently preferred metal, but the invention is not restricted to the use of gold or gold alloys.

Figure 4:
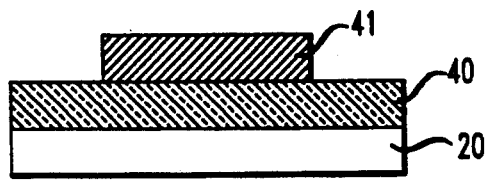
Figure 5:
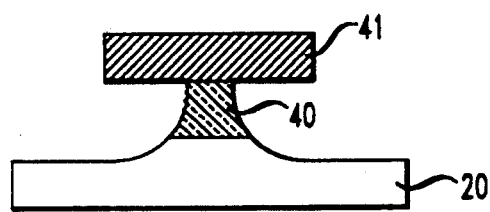

The invention is also not restricted to the use of ridges formed by selective etching, and FIGS. 4 and 5 schematically illustrate an alternative technique for ridge formation. On Si body 20 is relatively thick (e.g., 5 $\mu$m) SiO$_2$ layer 40 with patterned poly-Si layer 41 thereon. The combination is then etched in a known buffered oxide etchant until the poly-Si is substantially undercut, resulting in a texture substantially as shown in FIG. 5. After completion of texture etching, the poly-Si strips are removed by known means.

Figure 6:
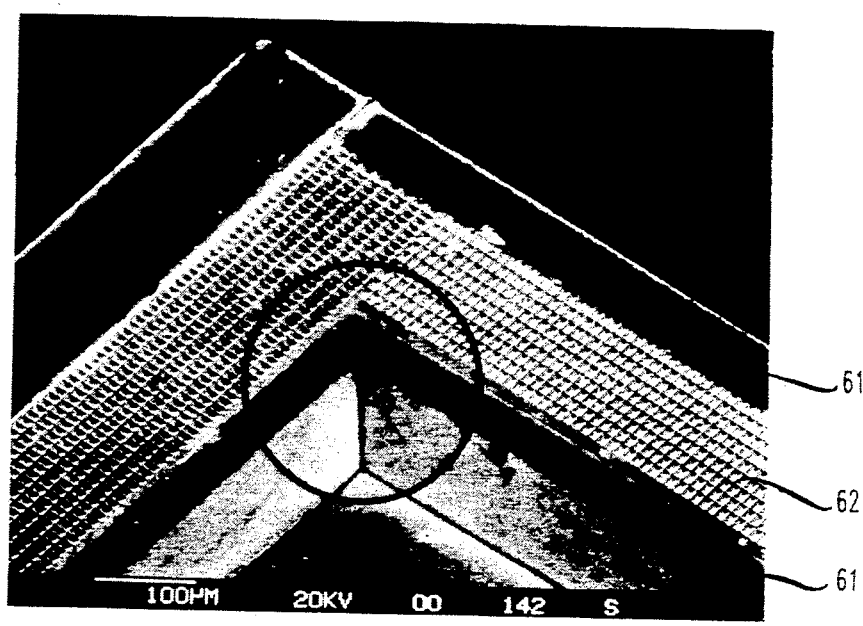
FIGS. 6 and 7 are micrographs of an exemplary textured bonding region.
Figure 7:
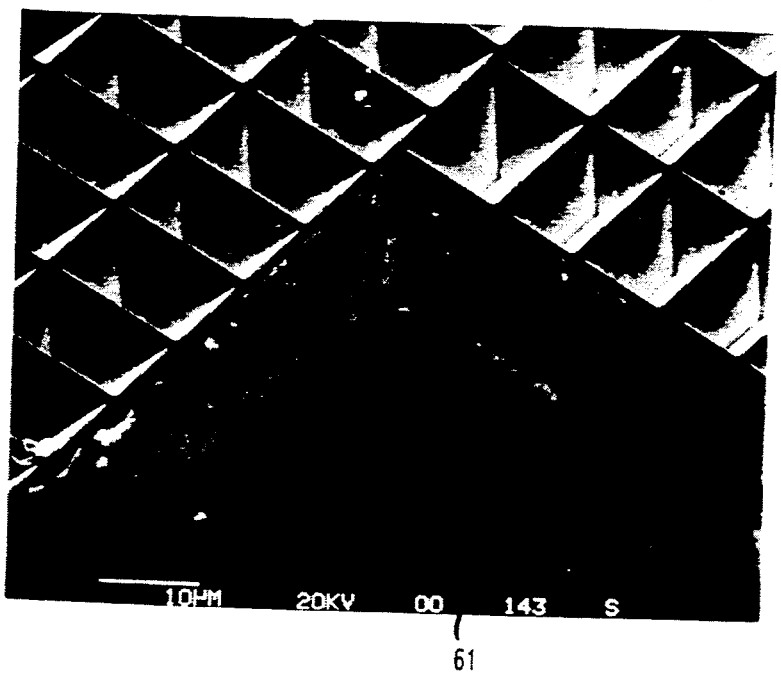

A significant aspect of the invention is the nature of the texture, and FIG. 6 shows a scanning electron microscope (SEM) micrograph of a relevant portion of a textured Si body. Numeral 60 refers to the recessed inner portion, 61 to untextured surface regions and 62 to the textured portion of the surface. FIG. 7 shows a SEM micrograph of a portion of the region within the circle in FIG. 6. As can be seen from FIGS. 6 and 7, the textured region compromises ridges of a first type that surround the recessed region, with ridges of a second type that extend between adjacent ridges of the first type. Ridges of the second type are optional but desirable, since they serve to reduce the probability that a single missing ridge would allow a leak between the inside of the box and the ambient. As those skilled in the art will recognize, a texture as shown in FIGS. 6 and 7 can be produced on a (100) Si wafer by known techniques.

Enclosures according to the invention can be used to provide a controlled environment not only for semiconductor lasers but also for other semiconductor devices, e.g., integrated circuits. They also have utility for, e.g., flat panel field emission displays. It is known that such displays typically require a high vacuum (e.g., 10$^{-9}$ Torr) to ensure long lifetime of the cathodes. Such a high vacuum requires a high temperature bake-out prior to sealing, and a reliable vacuum seal that can be made after the bake-out. TCB can advantageously be used since the bake-out does not affect the integrity of the relevant gold layers.

Figure 8:
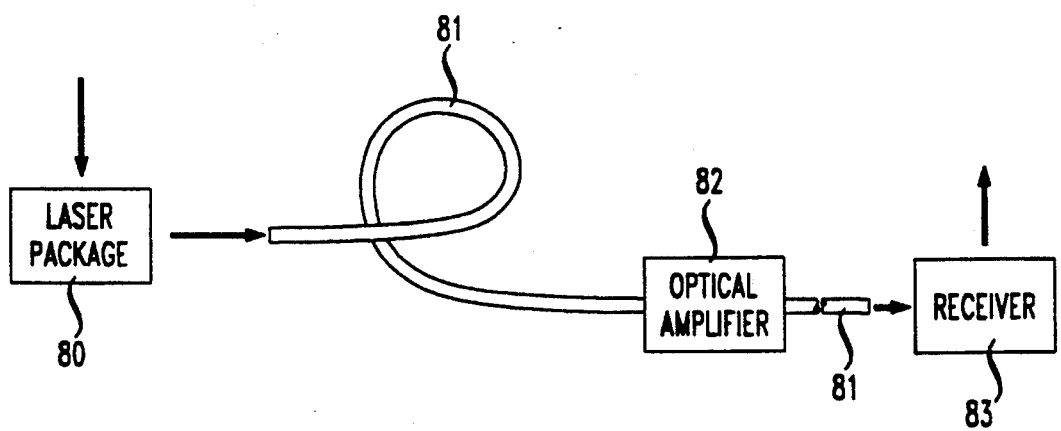
FIG. 8 schematically depicts a laser package according to the invention in an optical fiber communication system.

FIG. 8 schematically depicts an exemplary article according to the invention, namely, an optical fiber communication system that comprises hermetically sealed laser package 80. The package is, exemplarily, of the type illustrated in FIG. 1. The laser (not shown) emits radiation in response to an electrical signal, the radiation is coupled into optical fiber 81 and transmitted therethrough to receiver 83. FIG. 8 also shows optional optical amplifier 82 between the transmitter (which compromises the laser package) and the receiver.

EXAMPLE

A hermetic enclosure was formed as follows. Silicon "boxes" (3.6$\times$6/4$\times$0.5 mm$^3$) were made from a standard 5 inch (100)-oriented Si wafer by etching 2.9$\times$5.9$\times$0.1 mm recesses into the surface, gold plating to deposit a 10 $\mu$m thick "O-ring" surrounding each recess, and dicing the wafer, all by conventional methods. In particular, the etchant was a known diamine-based etchant. Si "lids" (3.4$\times$7 mm) were made from the same wafer in substantially the same way as the boxes, except that a textured region was formed by selective etching. The texture consisted of a waffle pattern substantially as shown in FIG. 7, with 10$\times$5 $\mu$m compartments. The pattern comprised 10 concentric and continuous ridges of the first type adapted to form, after TCB, ten separate barriers between the cavity and the ambient. The large number of ridges of the second type is adapted to further increase the barriers to leakage between the cavity and the ambient. The textured region was 6.0$\times$3.3 mm, with a width of 150 $\mu$m, was etched by the technique of FIGS. 2 and 3 and was covered with 0.5 $\mu$m of gold. After dicing to separate the lids, a box and a lid were pressed together in a He atmosphere, using a press with a floating anvil. The floating anvil was used to ensure that the compression was uniformly applied over the bonding region. The mechanical advantage of the press was 8.5, and the applied force was about 190N. After sealing, the package was maintained in 50 atm. He for 14 hours. The package was then leak-tested in a He leak detector and was found to be leak free to a level of 10$^{-9}$ sccm, the sensitivity limit of the leak detector.

Although TCB can be carried out at room temperature or even below, it can also be carried out at elevated temperatures. In preferred embodiments, box and lid will be made of the same material (e.g., Si), eliminating thermal stress during temperature cycling. Thus, at least in preferred embodiments, TCB can be done at any desired point in the assembly process, without regard for soldering steps which follow or precede.

We claim:

1. An article that comprises a first and a second body, at least one of said bodies having a surface that comprises a textured bonding region, with one of said bodies being compression bonded to the other of said bodies in said bonding region;

CHARACTERIZED at least one of said bodies has a surface that comprises a recessed portion that faces the other of said bodies, the textured bonding region surrounds an interior region that includes said recessed portion such that said first and second bodies are not in contact in said interior region, with one of said bodies comprising at least one raised feature in the bonding region, the raised feature to be referred to as a "ridge", with said ridge substantially enclosing said interior region and providing a barrier against entrance of gas from an ambient atmosphere into said interior region.

2. The article of claim 1 comprising at least two ridges in the bonding region that are continuous and substantially enclose the interior region, and comprising further ridges that extend between said at least two ridges.

3. The article of claim 2, wherein at least one of the first and second bodies is a silicon body, with a layer of gold-containing metal on said silicon body in the bonding region.

4. The article of claim 3, wherein both the first and the second body is a silicon body, with a layer of gold-containing metal on each of said silicon bodies in the bonding region.

5. The article of claim 4, wherein the second silicon body comprises said at least two ridges in the contact region, and wherein the gold-containing metal layer on the first silicon body is a layer that substantially surrounds the interior region and has a thickness greater than the thickness of the metal layer on the second silicon body.

6. The article of claim 1, wherein the article comprises a semiconductor device mounted in the interior region, and wherein said two bodies form an essentially hermetic enclosure.

7. The article of claim 6, wherein the semiconductor device is a semiconductor laser, and wherein an optical fiber extends into said hermetic enclosure.

8. An article according to claim 1, wherein the article is a flat panel display comprising field emitters, and wherein said two bodies are joined together to form an essentially hermetic enclosure, with said emitters located in said enclosure.

* * * * *